(12) United States Patent
Yu et al.

(10) Patent No.: US 9,484,524 B2
(45) Date of Patent: Nov. 1, 2016

(54) PIEZOELECTRIC COMPOSITIONS

(71) Applicant: The Johns Hopkins University, Baltimore, MD (US)

(72) Inventors: Michael Yu, Timonium, MD (US); James E. West, Baltimore, MD (US); Ilene J. Busch-Vishniac, Baltimore, MD (US); Dawnielle Farrar, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 14/146,325

(22) Filed: Jan. 2, 2014

(65) Prior Publication Data
US 2014/0117272 A1    May 1, 2014

Related U.S. Application Data

(62) Division of application No. 12/376,882, filed as application No. PCT/US2007/017725 on Aug. 8, 2007, now Pat. No. 8,641,919.

(60) Provisional application No. 60/836,558, filed on Aug. 9, 2006.

(51) Int. Cl.
   *H01L 41/18*    (2006.01)
   *H01L 41/193*   (2006.01)

(52) U.S. Cl.
   CPC .......... *H01L 41/183* (2013.01); *H01L 41/193* (2013.01)

(58) Field of Classification Search
   None
   See application file for complete search history.

(56) References Cited

U.S. PATENT DOCUMENTS

| | | |
|---|---|---|
| 3,196,098 A | 7/1965 | Mochel |
| 4,265,841 A | 5/1981 | Fujimori et al. |
| 4,921,928 A | 5/1990 | Tanino et al. |
| 4,983,313 A | 1/1991 | Kaneko et al. |
| 4,994,703 A | 2/1991 | Oguri et al. |
| 5,030,999 A | 7/1991 | Lindblad et al. |
| 5,298,602 A | 3/1994 | Shikinami et al. |
| 5,539,965 A | 7/1996 | Safari et al. |
| 5,997,134 A | 12/1999 | Hotomi et al. |
| 6,653,913 B2 | 11/2003 | Klee et al. |
| 2002/0173573 A1 * | 11/2002 | Borchers .......... B29C 70/58 524/413 |

FOREIGN PATENT DOCUMENTS

| | | | |
|---|---|---|---|
| EP | WO 2005/069858 | * | 8/2005 |
| JP | 63020362 | | 1/1988 |

* cited by examiner

*Primary Examiner* — Ana Woodward
(74) *Attorney, Agent, or Firm* — Mintz Levin Cohn Ferris Glovsky and Popeo, P.C.; Peter F. Corless; Richard B. Emmons

(57) ABSTRACT

Piezoelectric compositions are provided wherein mechanical and piezoelectric properties can be separately modulated. Preferred compositions include resin blends that comprise: (a) a piezoelectrically active polymer and (b) a matrix polymer, methods of making, and use of such resin blends. Advantages of preferred resin blends of the invention can include high piezoelectricity, mechanical strength and flexibility, convenient fabrication process, and high sensitivity at high temperatures.

8 Claims, 7 Drawing Sheets

Polarized light optical micrograph

FT-IR Spectrum
PBLG/PMMA composite film

TEM

PIEZOELECTRIC COMPOSITIONS

CROSS REFERENCE TO RELATED APPLICATIONS

The present application is a Divisional of U.S patent application Ser. No. 12/376,882, filling date May. 25, 2010, which is a national phase application pursuant to 35 U.S.C. §371 of International Application No. PCT/US2007/017725, filing date Aug. 8, 2007, which claims the benefit of U.S. provisional application number 60/836,558, filed Aug. 9, 2006, which are incorporated herein by reference in their entireties.

FIELD OF THE INVENTION

In one aspect, the invention provides a piezoelectric organic resin blend comprising: (a) a piezoelectrically active polymer and (b) a matrix polymer. In preferred embodiments, piezoelectric compositions are provided where mechanical (physical integrity, flexibility) and piezoelectric properties can be separately modulated, where such composition characteristics reside in distinct composition components.

BACKGROUND

Several years ago, it was realized that films of cellular polypropylene reveal considerable piezoelectric ($d_{33}$) effects after charging (X. Zhang, J. Hillenbrand, and G. M. Sessler, "Piezoelectric d33 coefficient of cellular polypropylene subjected to expansion by pressure treatment," Appl. Phys. Lett. 85, 1226 (2004)).

It was suggested that cellular polypropylene might find use in electroacoustic and electromechanical transducers due to its ability to reach frequency ranges higher than that of polyvinylideneflouride (PVDF). To date, work has focused on microphones using cellular polypropylene films, particularly a five-layer polypropylene film of 40 um thickness, also known as Low Density Polypropylene (LDPP-VHD40) (J. Hillenbrand, and G. M. Sessler, "High sensitivity piezoelectric microphones based on stacked cellular polymer films (L)," J. Acoust. Soc. Am. 116, 3267 (2004)). Since this discovery, additional research on LDPP has revealed that expansion of cellular polypropylene films, through an increase in gas pressure and subsequent pressure at elevated temperatures (prior to charging), enhances the piezoelectric $d_{33}$ coefficient of the film.

The desire to find another material (preferably polymer) that exhibits similar characteristics to LDPP stems from the knowledge gained when analyzing the VHD40 and VHD50 forms of LDPP. The reasoning behind this pursuit arose from the question of whether one could create a polymer that had very similar piezoelectric effects to LDPP, using chemistry/chemical reactions.

Piezoelectric materials (PM) applied in many fields are made of ceramic crystals. Despite high piezoelectricity, they are brittle and require expensive processing conditions. Ideal PM are those with their electrical and mechanical properties decoupled so that the mechanical stiffness of the materials can be varied for a particular application or tuned to match that of the surroundings (e.g. air or water) for increased transduction sensitivity.

Piezoelectric materials are the key components of electromechanical transducers (sensors and actuators) for automatic control systems, and measurement and monitoring systems. They have become ubiquitous in our world, being found in everyday products from microphone and speakers to computers and automobiles. The history of electromechanical transducers reads like a timeline for materials inventions, with each new electrical-mechanical coupling mechanism discovery leading to new devices and applications. Piezoelectricity was first discovered in quartz by Curie in 1880, but most of the materials in use today are barium titanate ($BaTiO_3$) and lead zirconate titanate (PZT). $BaTiO_3$ and PZT have high piezoelectric responses ($d_{33} \approx 400$ pC/N) but because they are ceramic materials they tend to be expensive, heavy, and brittle. Recent efforts toward soft piezoelectric materials have led to the discovery of piezoelectricity in mechanically stretched poly(vinylidenefluoride) (PVDF, $d_{33} \approx 23$ pC/N) film and low density poly (propylene) (LDPP, $d_{33} \approx 200$ pC/N) foams [ref]. These soft piezoelectric materials require special processing conditions, have low Curie temperatures, and suffer from mechanical fatigue. On the other hand, many natural materials are soft and piezoelectric; keratins, collagens, and other fibrous biopolymers exhibit $d_{33}$ coefficients on the order of and are believed to originate from protein's polar character. Unfortunately, natural biopolymers alone have poor thermal stability and limited processability which make them unsuitable for fabricating practical transducer devices.

Biopolymer poly(γ-benzyl α,L-glutamate) (PBLG) is a helical polypeptide which was discovered through x-ray diffraction, and it was realized that PBLG in solution can be oriented under magnetic and electric field. Macroscopic orientation of PBLG dipoles may lead to piezoelectric activity; however, to date polar film of PBLG with high piezoelectricity has not been realized.

It thus would be desirable to provide a new approach to the fabrication of piezoelectric materials and films.

SUMMARY OF THE INVENTION

We now provide new piezoelectric composite materials, which are in the form of e.g. resin blend, nanofiber, film, coating, membrane, substrate, web, mesh, fabric, or matrix.

In preferred embodiments, piezoelectric compositions are provided where mechanical (physical integrity, flexibility) and piezoelectric properties reside in distinct composition components and can be separately modulated. That is, in such embodiments, electrical and mechanical parameters can be decoupled, making the piezoelectric film composition highly useful for diverse applications such as various transducer, loudspeaker, and other electronic applications.

For instance, in such "decoupled" embodiments, a piezoelectric composition of the invention may comprise a blend of materials where one or more materials may be utilized to provide desired physical properties (e.g. mechanical toughness, flexibility, etc.) and one or more distinct materials may be utilized to provide desired piezoelectric properties to the composition. More particularly, the piezoelectric composition may comprise a blend of at least two distinct resins, where the type or amount of one resin may be modulated (relative amount in resin blend increased or deceased) to provide desired physical properties (such as mechanical toughness, and/or flexibility) and the other piezoelectrically active resin of the blend may be modulated (relative amount in resin blend increased or decreased) to provide desired piezoelectric properties. In other aspects, a piezoelectric composition may comprise a single component, e.g. a single resin, but where mechanical and electrical properties are imparted by distinct resin moieties (e.g. distinct resin repeat units of a copolymer, terpolymer or other higher order polymer).

In one aspect, the invention provides a piezoelectric resin blend comprising: (a) a piezoelectrically active polymer and (b) a matrix polymer.

In another aspect, the invention provides a piezoelectric resin blend comprising: (a) poly(γ-benzyl α,L-glutamates)

(PBLG) and (b) a matrix polymer, wherein the PBLG is oriented at an angle with respect to a poling direction.

In one aspect, the invention is directed towards methods of making a piezoelectric resin blend by combining the high piezoelectricity of a biopolymer and the mechanical strength of a matrix polymer to create a flexible polymer composite with extremely high piezoelectricity. Such a fabrication process has a fabrication advantage in that the process does not require high temperature curing or mechanical stretching.

In other aspects, the invention is directed to a method of making a piezoelectric resin blend comprising (a) a piezoelectrically active polymer and (b) a matrix polymer, comprising the steps of (A) dissolving a piezoelectrically active polymer in a matrix polymer monomer solution; (B) polymerizing the matrix polymer monomer by corona charging; and (C) poling the polymer composite material by corona charging.

In another aspect, the invention provides a method of making a piezoelectric resin blend comprising (a) a piezoelectrically active polymer and (b) a matrix polymer, comprising the steps of (A) dissolving a piezoelectrically active polymer in a matrix polymer monomer solution; (B) poling the polymer composite material, such as by corona charging; and (C) polymerizing the matrix monomer such as by radial initiation.

In certain aspects, the invention is directed towards a method of making a piezoelectric resin blend comprising (a) a piezoelectrically active polymer and (b) a matrix polymer, comprising the steps of (A) dissolving a piezoelectrically active polymer in an organic solvent; (B) adding a matrix polymer monomer solution; (C) poling the matrix polymer monomer by corona charging; and (D) curing the polymer composite material by corona charging.

In another aspect, the invention is directed towards a method of making a piezoelectric resin blend comprising (a) a piezoelectrically active polymer and (b) a matrix polymer, comprising the steps of (A) dissolving a piezoelectrically active polymer in an organic solvent; (B) adding a matrix polymer monomer solution; (C) polymerizing the matrix polymer monomer by radial initiation; and (D) poling the polymer composite material by corona charging.

In other aspects, the invention is directed towards the use of such piezoelectric materials of the invention to improve performance of conventional products (e.g. microphone, speakerphone, and pressure sensors not requiring pressure equalization); in certain unconventional products such as piezoelectric coatings or a speaker in a form of a wall paper; as transducers (sensors and actuators) which are critical elements of automatic control systems, and measurement and monitoring systems; as a light weight transducer, or a foldable speaker or speaker array.

In additional aspects, piezoelectric materials are provided in the form of nanofibers. Such nanofibers may be provided by electrospinning. In one embodiment, the electrospun fiber piezoelectric compositions comprise randomly oriented fibers. In alternative embodiments, the electrospun fiber piezoelectric compositions comprise aligned fibers. The electrospun fiber piezoelectric compositions can be produced by electrospinning methods known in the art, e.g., uniaxial electrospinning, coaxial electrospinning or multi-axial electrospinning.

Other aspects of the invention are disclosed infra.

DETAILED DESCRIPTION OF THE INVENTION

Definitions

Figure 1:
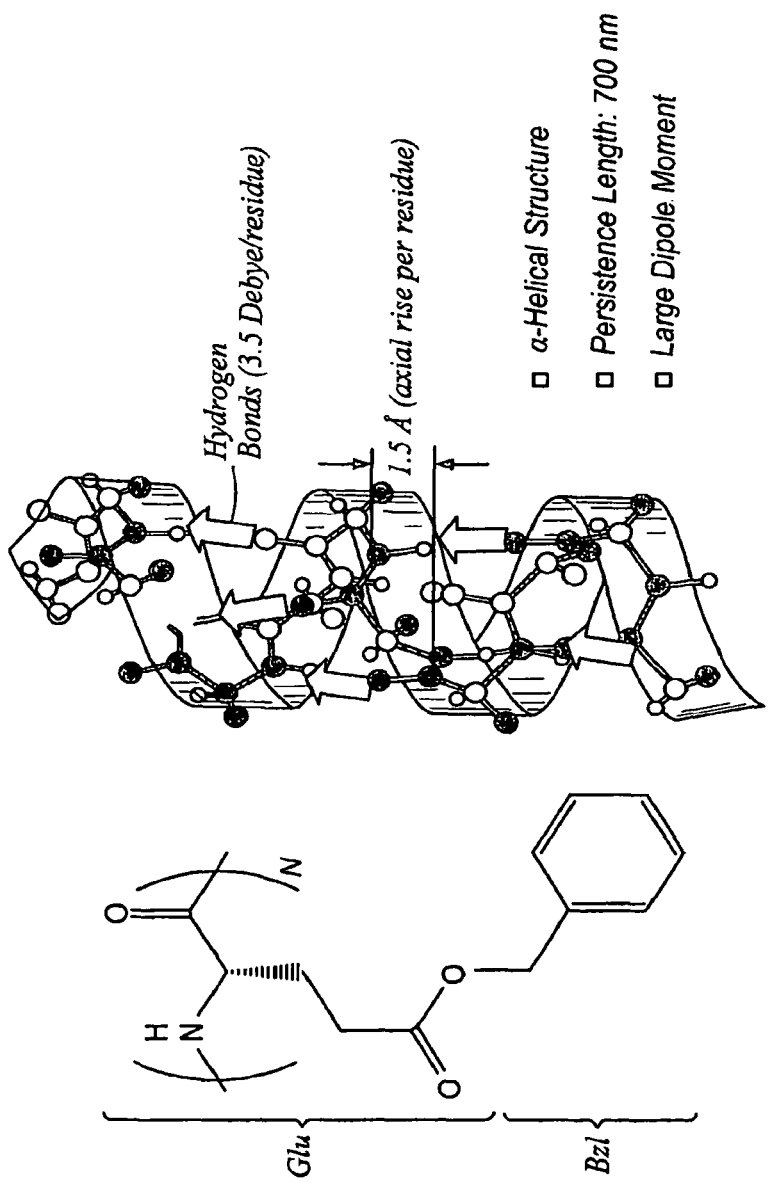
FIG. 1 shows structure of PBLG and the origin of piezoelectricity in PBLG.

Before a further description of the present invention, and in order that the invention may be more readily understood, certain terms are first defined and collected here for convenience.

As used herein, the term "curing" refers to in-situ polymerization of a polymer matrix under the corona charging conditions.

As used herein, the term "corona charging" refers to the impact of charged atoms or molecules (ions) on charged bodies. Copious quantities of ions may be generated by a corona discharge, which is a region in which an intense electric field acts upon air molecules and ionizes them so that free ions are produced. A sharply pointed electrode maintained at a high positive or negative potential induces a stream of positive or negative ions which may be used for charging surfaces. Ions from a corona discharge may be used to charge isolated bodies, insulating surfaces or particles by simply directing a corona wind onto the surface to be charged. In the case of particles, it is normally sufficient for them to pass through a corona discharge region to receive a significant charge from ion-particle collisions.

As used herein, the term "piezoelectric material" refers to materials that have the ability to generate an electric charge in response to applied mechanical stress.

As used herein, the term "poling" refers to affecting the orientation of a piezoelectrically active materials such as PBLGs by external forces such as magnetic or electrical field. Poling can include electrically stressing the material under e.g. DC voltage or a corona derived from a needle point connected to a high DC voltage source in close proximity to the surface of the material under study, wherein both time of exposure and the polling temperature are active parameters.

As used herein, the term "alkyl" refers to a straight-chained or branched hydrocarbon group containing 1 to 12 carbon atoms, which may be substituted. The term "lower alkyl" refers to a C1-C6 alkyl chain. Examples of alkyl groups include methyl, ethyl, n-propyl, isopropyl, tert-butyl, and n-pentyl.

The term "alkenyl" refers to an unsaturated hydrocarbon chain that may be a straight chain or branched chain, containing 2 to 12 carbon atoms and at least one carbon-carbon double bond. Alkenyl groups may be optionally substituted with one or more substituents.

The term "alkynyl" refers to an unsaturated hydrocarbon chain that may be a straight chain or branched chain, containing the 2 to 12 carbon atoms and at least one carbon-carbon triple bond. Alkynyl groups may be optionally substituted with one or more substituents.

The $sp^2$ or sp carbons of an alkenyl group and an alkynyl group, respectively, may optionally be the point of attachment of the alkenyl or alkynyl groups.

The term "alkoxy" refers to an —O-alkyl radical. Preferred alkoxy groups of compounds of the invention include groups having one or more oxygen linkages and from 1 to about 12 carbon atoms, more preferably from 1 to about 8 carbon atoms, and still more preferably 1, 2, 3, 4, 5 or 6 carbon atoms.

As used herein, the term "halogen" or "halo" means —F, —Cl, —Br or —I.

As used herein, the term "haloalkyl" means and alkyl group in which one or more (including all) the hydrogen radicals are replaced by a halo group, wherein each halo group is independently selected from —F, —Cl, —Br, and —I. Representative haloalkyl groups include trifluoromethyl, bromomethyl, 1,2-dichloroethyl, 4-iodobutyl, 2-fluoropentyl, and the like.

The term "cycloalkyl" or "cyclic" refers to a hydrocarbon 3-8 membered monocyclic or 7-14 membered bicyclic ring system having at least one non-aromatic, wherein the ring may have some degree of unsaturation. Cycloalkyl groups may be optionally substituted with one or more substituents. In one embodiment, 0, 1, 2, 3, or 4 atoms of each ring of a cycloalkyl group may be substituted by a substituent. Representative examples of cycloalkyl group include cyclopropyl, cyclopentyl, cyclohexyl, cyclobutyl, cycloheptyl, cyclooctyl, cyclononyl, cyclohexenyl, dihydronaphthalenyl, cyclopentenyl, cyclopentadienyl, cyclohexadienyl and cyclodecyl, and the like.

The term "aryl" refers to a hydrocarbon monocyclic, bicyclic or tricyclic aromatic ring system. Aryl groups may be optionally substituted with one or more substituents. In one embodiment, 0, 1, 2, 3, 4, 5 or 6 atoms of each ring of an aryl group may be substituted by a substituent. Examples of aryl groups include phenyl, naphthyl, anthracenyl, fluorenyl, indenyl, azulenyl, and the like.

As used herein, the term "aralkyl" means an aryl group that is attached to another group by a $(C_1-C_6)$alkylene group. Aralkyl groups may be optionally substituted, either on the aryl portion of the aralkyl group or on the alkylene portion of the aralkyl group, with one or more substituent. Representative aralkyl groups include benzyl, 2-phenyl-ethyl, naphth-3-yl-methyl, methylenenaphthyl (—CH$_2$-naphthyl), and the like.

The term "heteroaryl" refers to an aromatic 5-8 membered monocyclic, 8-12 membered bicyclic, or 11-14 membered tricyclic ring system having 1-4 ring heteroatoms if monocyclic, 1-6 heteroatoms if bicyclic, or 1-9 heteroatoms if tricyclic, said heteroatoms selected from O, N, or S, and the remainder ring atoms being carbon (with appropriate hydrogen atoms unless otherwise indicated). Heteroaryl groups may be optionally substituted with one or more substituents. In one embodiment, 0, 1, 2, 3, or 4 atoms of each ring of a heteroaryl group may be substituted by a substituent. Examples of heteroaryl groups include pyridyl, furanyl, thienyl, pyrrolyl, oxazolyl, oxadiazolyl, imidazolyl, thiazolyl, quinolinyl, pyrazolyl, pyridazinyl, pyrimidinyl, pyrazinyl, triazinyl, and the like. Suitable heteroaromatic groups of compounds of the invention contain one or more N, O or S atoms and include, e.g., coumarinyl including 8-coumarinyl, quinolinyl including 8-quinolinyl, pyridyl, pyrazinyl, pyrimidyl, furyl, pyrrolyl, thienyl, thiazolyl, oxazolyl, oxidizolyl, triazole, imidazolyl, indolyl, benzofuranyl and benzothiazole.

As used herein, the term "heteroaralkyl" or "heteroarylalkyl" means a heteroaryl group that is attached to another group by a $(C_1-C_6)$alkylene. Heteroaralkyl groups may be optionally substituted, either on the heteroaryl portion of the heteroaralkyl group or on the alkylene portion of the heteroaralkyl group, with one or more substituent. Representative heteroaralkyl groups include 2-(pyridin-4-yl)-propyl, 2-(thien-3-yl)-ethyl, imidazol-4-yl-methyl and the like.

The term "heterocycloalkyl" refers to a nonaromatic 5-8 membered monocyclic, 8-12 membered bicyclic, or 11-14 membered tricyclic ring system comprising 1-3 heteroatoms if monocyclic, 1-6 heteroatoms if bicyclic, or 1-9 heteroatoms if tricyclic, said heteroatoms selected from O, N, S, B, P or Si. Heterocycloalkyl groups may be optionally substituted with one or more substituents.

In one embodiment, 0, 1, 2, 3, or 4 atoms of each ring of a heterocycloalkyl group may be substituted by a substituent. Representative heterocycloalkyl groups include piperidinyl, piperazinyl, tetrahydropyranyl, tetrahydrothiopyranyl, morpholinyl, thiomorpholinyl, 1,3-dioxolane, and tetrahydrofuranyl.

The term "heterocyclic" refers to a nonaromatic 5-8 membered monocyclic, 8-12 membered bicyclic, or 11-14 membered tricyclic ring system comprising 1-3 heteroatoms if monocyclic, 1-6 heteroatoms if bicyclic, or 1-9 heteroatoms if tricyclic, said heteroatoms selected from O, N, S, B, P or Si, wherein the nonaromatic ring system has some degree of unsaturation. Heterocyclyl groups may be optionally substituted with one or more substituents. In one embodiment, 0, 1, 2, 3, or 4 atoms of each ring of a heterocyclyl group may be substituted by a substituent. Examples of these groups include thiirenyl, thiadiazirinyl, dioxazolyl, 1,3-oxathiolyl, 1,3-dioxolyl, 1,3-dithiolyl, oxathiazinyl, dioxazinyl, dithiazinyl, oxadiazinyl, thiadiazinyl, oxazinyl, thiazinyl, 1,4-oxathiin, 1,4-dioxin, 1,4-dithiin, 1H-pyranyl, oxathiepinyl, 5H-1,4-dioxepinyl, 5H-1,4-dithiepinyl, 6H-isoxazolo[2,3-d]1,2,4-oxadiazolyl, 7aH-oxazolo[3,2-d]1,2,4-oxadiazolyl, and the like.

Suitable heteroaralkyl groups of compounds of the invention include single and multiple ring compounds, including multiple ring compounds that contain separate and/or fused heteroaromatic groups, where such groups are substituted onto an alkyl linkage. More preferably, a heteroaralkyl group contains a heteroaromatic group that has 1 to 3 rings, 3 to 8 ring members in each ring and from 1 to 3 hetero (N, O or S) atoms, substituted onto an alkyl linkage. Suitable heteroaromatic groups substituted onto an alkyl linkage include, e.g., coumarinyl including 8-coumarinyl, quinolinyl including 8-quinolinyl, pyridyl, pyrazinyl, pyrimidyl, furyl, pyrrolyl, thienyl, thiazolyl, oxazolyl, oxidizolyl, triazole, imidazolyl, indolyl, benzofuranyl and benzothiazole.

The term "alkylamino" refers to an amino substituent which is further substituted with one or two alkyl groups.

The term "aminoalkyl" refers to an alkyl substituent which is further substituted with one or more amino groups. Preferred aminoalkyl groups include those groups having one or more primary, secondary and/or tertiary amine groups, and from 1 to about 12 carbon atoms, more preferably 1 to about 8 carbon atoms, still more preferably 1, 2, 3, 4, 5, or 6 carbon atoms.

As used herein the term "substituent" or "substituted" means that a hydrogen radical on a compound or group (such as, for example, alkyl, alkenyl, alkynyl, alkylene, aryl, aralkyl, heteroaryl, heteroaralkyl, cycloalkyl, or heterocycloalkyl, is replaced with any desired group that do not substantially adversely affect the stability of the compound. The term "substituted" refers to one or more substituents (which may be the same or different), each replacing a hydrogen atom. Examples of substituents include, but are not limited to, halogen (F, Cl, Br, or I), hydroxyl, amino, alkylamino, arylamino, dialkylamino, diarylamino, cyano, nitro, mercapto, oxo (i.e., carbonyl), thio, imino, formyl, carbamido, carbamyl, carboxyl, thioureido, thiocyanato, sulfoamido, sulfonylalkyl, sulfonylaryl, alkyl, alkenyl, alkoxy, mercaptoalkoxy, aryl, heteroaryl, cycloalkyl, heterocycloalkyl, wherein alkyl, alkenyl, alkyloxy, aryl, heteroaryl, cycloalkyl, and heterocycloalkyl are optionally substituted with alkyl, aryl, heteroaryl, halogen, hydroxyl, amino, mercapto, cyano, nitro, oxo (=O), thioxo (=S), or imino (=NR).

Piezoelectric Polymer Compositions of the Invention In one aspect, the invention is directed towards a piezoelectric composition comprising one or more resins, wherein mechanical and piezoelectric properties can be separately modulated.

In one embodiment, the one or more resins are organic polymers. In another embodiment, distinct resins are cross-linked.

In another aspect, the invention provides a piezoelectric resin blend comprising: (a) a piezoelectrically active polymer and (b) a matrix polymer.

In one embodiment, the piezoelectrically active polymer is a biopolymer, a polyester, a polyamide, a poly(acrylate), an aromatic polymer, or an aromatic polyester.

In another embodiment, the piezoelectrically active polymer is a polymer or copolymer selected from poly(γ-benzyl α,L-glutamates) (PBLG), vinyl PBLG, polystyrene, polypropylene, low density polypropylene, polyvinylidene fluoride (PVDF), polyvinylidene fluoride-trifluoroethylene [P(VDF-TrFE)], poly(oxymethylene), nylon 6, nylon 66, nylon 610, epoxies, polyurethanes, cellulose, foam FEP, glass beaded FEP, porous PTFE, glass resins, and mixtures thereof. In a further embodiment, the piezoelectrically active polymer is poly(γ-benzyl α,L-glutamate) (PBLG).

In other embodiments, the piezoelectrically active polymer is a polymer or copolymer selected from low density polypropylene, foam FEP, glass beaded FEP, porous PTFE, glass resins, and mixture thereof.

In certain embodiments, the piezoelectrically active polymer consists of repeat units ranging from about 20 to about 3500.

In another embodiment, the piezoelectrically active polymer is a cross-linked polymer. In certain embodiments, the cross-linked polymer is formed form a polymer having a cross-linking functionality. In a further embodiment, the cross-linking functionality is an olefin.

In one embodiment, the polymer comprises a repeat unit of the following Formula I,

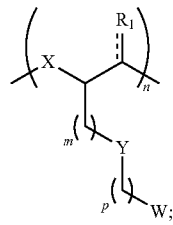

Formula I wherein

W is aryl, heteroaryl, cycloalkyl, or heteroalkyl; each of which may be substituted with 0-4 R;

Y is H, alkyl, alkenyl, alkynyl, haloalkyl, cycloalkyl, aryl, aralkyl, heteroaryl, CO, COO, NH, NR, CNH, or CNR, each of which may be optionally substituted;

X is alkyl, alkenyl, alkynyl, alkoxy, haloalkyl, cycloalkyl, aryl, aralkyl, heteroaryl, O, NH, NR, SH, or SR, each of which may be optionally substituted; and $R_1$ is H, O, OH, alkyl, alkenyl, alkynyl, or halogen;

m is 0 to 4;

n is 1 to 3500; and p is 0 to 2.

In certain embodiments, W is aryl and $R_1$ is H or alkenyl.

In another embodiment, the cross-linking polymer comprises a repeat unit of the following formula I is

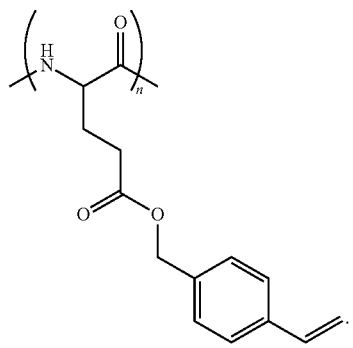

wherein n is 1 to 3500.

In other embodiments, the matrix polymer is an organic polymer. In certain embodiments, the matrix polymer is selected from methylmethacrylate (MMA), poly(methylmethacrylate) (PMMA), polyethylene, polyvinylchloride, or poly(1-butene).

In another embodiment, the matrix polymer is a silicone elastomer or silicone rubber.

In one embodiment, the matrix polymer consists of repeat units ranging from about 20 to about 3500.

In still other embodiments, the invention provides a piezoelectric resin blend wherein the blend comprises electrical and mechanical properties, wherein the electrical and mechanical properties are decoupled. In a further embodiment, the blend comprises a mechanical stiffness, wherein the mechanical stiffness may be varied for a particular application or tuned to match surroundings to increase transduction sensitivity.

In another embodiment, the blend is thermally stable. In yet another embodiment, the blend is thermally stable and maintains piezoelectricity above 80° C. In a further embodiment, the blend is thermally stable and maintains piezoelectricity between about 80° C. and about 2000° C.; in a further embodiment, the blend is thermally stable and maintains piezoelectricity between about 100° C. and about 500° C.

In certain embodiments, the piezoelectrically active polymer and the matrix polymer are structurally separate within the blend.

In other embodiments, the piezoelectrically active polymer is a soluble polymer within the matrix polymer.

In other embodiments, the piezoelectrically active polymers are aligned in a rod-like structure. In another embodiment, the polymers aligned in a rod-like structure form a helix. In a further embodiment, the helix structure is caused by hydrogen bonding of polymer repeat units. In still another further embodiment, each repeat unit of the polymer provides a dipole moment of about 1.0 to about 4.0 Debye. In other further embodiments, each repeat unit of the polymer provides a dipole moment of about 1.5 to about 3.5 Debye.

In certain embodiments, the blend provides a piezoelectrical activity ranging from about 1.0 V to about 10.0 V.

In another embodiment, the piezoelectrically active polymers are electrically poled. In certain embodiments, the piezoelectrically active polymers are aligned at an angle with respect to the poling direction.

In one embodiment, the piezoelectrically active polymers are substantially surrounded by the matrix polymer.

In other embodiments, the invention provides a piezoelectric resin blend which further comprises a reagent to improve poling. In a preferred embodiment, such a reagent is selected from trifluoroacetic acid (TFA), plasticizers and polymer additives.

In various embodiments, the blend provides a piezoelectric constant ($d_{33}$) ranging from about 10 pC/N to about 200 pC/N. In certain embodiments, the piezoelectric constant ($d_{33}$) ranges from about 100 pC/N to about 150 pC/N.

The piezoelectric polymer blends of the instant invention are provided in certain instances as a nanofiber, film, coating, membrane, substrate, web, mesh, fabric, or matrix.

In one embodiment, the blend is a film, which is flexible in certain embodiments. The thickness of such a film ranges from about 5 μm to about 500 μm. In certain embodiments, the film has a thickness ranging from about 25 μm to about 100 μm.

The piezoelectric polymer blend films of the invention suitably may have e.g. a strength ranging from about 1 MPa to about 15 MPa. In certain embodiments, the film has a strength ranging from about 4 MPa to about 6 MPa.

In another embodiment, the blend is a nanofiber. As discussed above, preferred nanofibers of the invention may be produced by electrospinning which can include processes that use an electric field to draw a solution comprising, for example, a polymer mixture of the invention from the tip of the capillary to a collector. A high voltage DC current is applied to the solution which causes a jet of the solution to be drawn towards the grounded collector screen. Once ejected out of the capillary orifice, the charged solution jet gets evaporated to form fibers and the fibers get collected on the collector. The size and morphology of the fibers thus obtained depends on a variety of factors such as viscosity of the solution, molecular weight, nature of the polymer or ceramic and other parameters regarding the electrospinning apparatus. The electrospinning process to form polymer nanofibers has been demonstrated using a variety of polymers [Huang, et al. Composites Science and Technology 2003; 63]. See also U.S. Pat. No. 6,852,709, issued Feb. 8, 2005 for electrospinning. Piezoelectric nanofibers of the invention also can be produced by electrostatic spinning which is a process by which polymer fibers of nanometer to micrometer size in diameters and lengths up to several kilometers can be produced using an electrostatically driven jet of polymer solution or polymer melt.

Preferred piezoelectric nanofibers of the invention may have e.g. d(31) values from 10 pC/N to 100 pC/N. Preferred piezoelectric nanofibers of the invention may have D(33) values from 10 pC/N to 200 pC/N. Particularly preferred piezoelectric nanofibers of the invention include those where both d(31) and d(33) are active in a single transducer. As understood, D(33) and d(31) are known piezoelectric values (see descriptions e.g. in U.S. Pat. Nos. 7,101,491 and 7,045,075).

In another embodiment, the invention provides a piezoelectric resin blend wherein the piezoelectrically active polymers comprise from about 10 to about 80 weight % of the total blend volume. In a further embodiment, the piezoelectrically active polymers comprise from about 20 to about 50 weight % of the total blend volume.

In another embodiment, the blend is substantially free of voids.

In addition to the polymer resins, the piezoelectric resin blend may further comprise a component selected from a metal oxide, metal composite, glass fibers, clay, epoxy, glass, air, ceramic, and mixtures thereof.

In certain embodiments, preferred piezoelectric compositions of the invention do not comprise any ceramic materials, including any sintered materials, or at least the piezoelectric compositions are substantially free of ceramic materials (e.g. where the piezoelectric composition contains less than 10, 5, 3, 2 or 1 weight percent of ceramic material based on total weight of the piezoelectric composition). In related embodiments, preferred piezoelectric compositions of the invention do not comprise any inorganic materials, or at least the piezoelectric compositions are substantially free of inorganic materials (e.g. where the piezoelectric composition contains less than 10, 5, 3, 2 or 1 weight percent of inorganic material based on total weight of the piezoelectric composition).

In another aspect, the invention provides for a piezoelectric resin blend comprising: (a) poly(γ-benzyl α,L-glutamates) (PBLG) and (b) a matrix polymer, wherein the PBLG is oriented at an angle with respect to a poling direction. In certain embodiments, the matrix polymer comprises alkyl acrylate units.

In certain aspects, the invention is directed towards a new class of polymer composite piezoelectric material (PM) based on the piezoactive biopolymer poly(γ-benzyl α,L-glutamate) (PBLG), and a matrix polymer, poly(methylmethacrylate) (PMMA). By simultaneous poling and curing of PBLG/MMA mixture solutions such as via corona charging, a flexible composite films can be fabricated with a significant portion of the PBLG molecules oriented normal to the film surface. Produced films can exhibit high piezoelectricity (e.g. $d_{33} \geq 15$ or 20 pC/N), with mechanical characteristics similar to those of low molecular weight PMMA, indicating that the piezoelectricity and mechanical strength are independently related to the two polymer components of the composite film.

Such preferred piezoelectric films can be fabricated e.g. directly from solution on a substrate or in a mould. Therefore this film is amenable to miniaturization for small sensors with integrated electronics or can be used in piezoelectric coating applications.

For certain applications, we sought to achieve a piezoelectric effect comparable to low density poly(propylene) (LDPP). LDPP has the highest known polymer piezoelectric compression response ($d_{33} \approx 200$ pC/N); however, this material contains an artificial/pseudo dipole. LDPP's piezoelectric response is produced by charge-rearrangement once the material is compressed. This response is heavily dependent on the charge separation around the voids. The bulk material is harder than the actual voids in the material. As a result, the piezoelectric response is limited by the compliance of the bulk. With the composite film under evaluation, the goal is to obtain a piezoelectric effect comparable to that of LDPP, in addition to providing decoupled electrical and mechanical parameters, making the composite film ideal for various transducer, loudspeaker, and other electronic applications.

α-Helical polypeptides are known to exhibit a strong dipole moment due to the polar alignment of hydrogen bonds along the peptide helical axis (see FIG. 1). Prior work has demonstrated that rod-like polypeptides consisting of long α-helical polypeptides are piezoelectric in nature. In particular, poly(γ-benzyl α,L-glutamate) (PBLG) is a well known rod-like α-helical polypeptide for which applications have been proposed in photonics, electronics, chemical sensors and drug delivery. PBLG is produced synthetically by ring-opening polymerization of cyclic precursor monomers and samples of various average molecular weights (10,000 g/mol~100,000 g/mol). PBLG can be prepared by controlled living polymerization or by fractionation of polymer mixtures. It has been reported that each amino acid unit of PBLG contributes approximately 3.5 Debye to the total helix dipole making PBLG one of the most polar organic molecules known to date. The unique characteristics of PBLG compared to other natural biopolymers are their extreme solubility in organic solvents and helical stability. In many organic solvents (e.g. THF, chloroform, dioxane, DMF) PBLG can form concentrated liquid crystalline phases that contain up to 30 weight percent PBLG molecules. PBLG helices are stable in solution and in solid films, and at temperature as high as 130° C. It is understood that the helical peptide hides most of its structure-determining polar groups in the interior (center) of the helix while exposing only the hydrophobic side chains to the solvents making this protein appear hydrophobic and less vulnerable to structural disruption.

While piezoelectricity and nonlinear optical properties of pure PBLG have been documented in the literatures, most of the work to date has focused on formation of ultra thin PBLG films on solid substrates. Despite various attempts to orient PBLG rods in the direction normal to the film surface to maximize piezoelectric response, in most cases, PBLG rods in thin films tend to orient parallel to the film surfaces due to preferential interactions between PBLG and the solid substrates. In contrast, little work has been devoted to exploring the piezoelectric property of thick PBLG films where reduction in surface area may work in favor of PBLG orientation and allow higher piezoelectric activity.

Certain composites formed by placing a ceramic piezoelectric material in a polymer matrix have been pursued. The bulk of the work has been on 1-3 composites, in which rods of piezoelectric materials (PZT or $BaTiO_3$) are embedded in a polymer matrix. Compared to the standard piezoelectric materials, 1-3 composites are light and more rugged although the fabrication process involves multiple steps that are quite expensive. Applications of piezoelectric 1-3 composites have focused on sonar development but there has been increasing interest in their use for non-destructive evaluation of structures and acoustic monitoring of faults in the nuclear industry. See Near et al., J Acoust. Soc. Am. May 1997—Volume 101, Issue 5, p. 3094.

Figure 2:
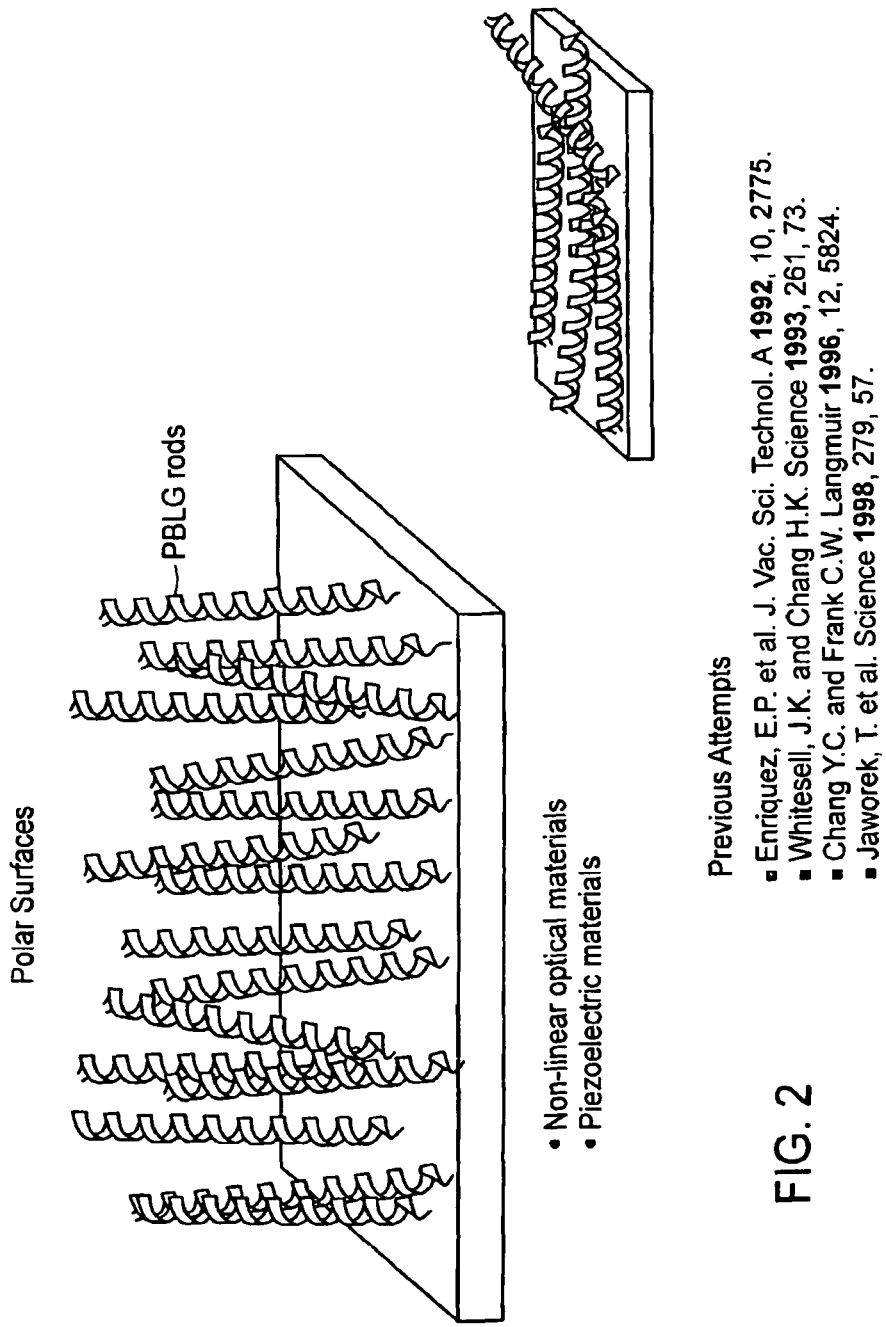
FIG. 2 shows polar and piezoelectrically active film formed by orienting the PBLGs in the direction normal to the film surface. The Fourier Transform Infrared (FT-IR) spectroscopy confirm the α-helical structure of PBLG within the PBLG/PMMA composite film.
Figure 3:
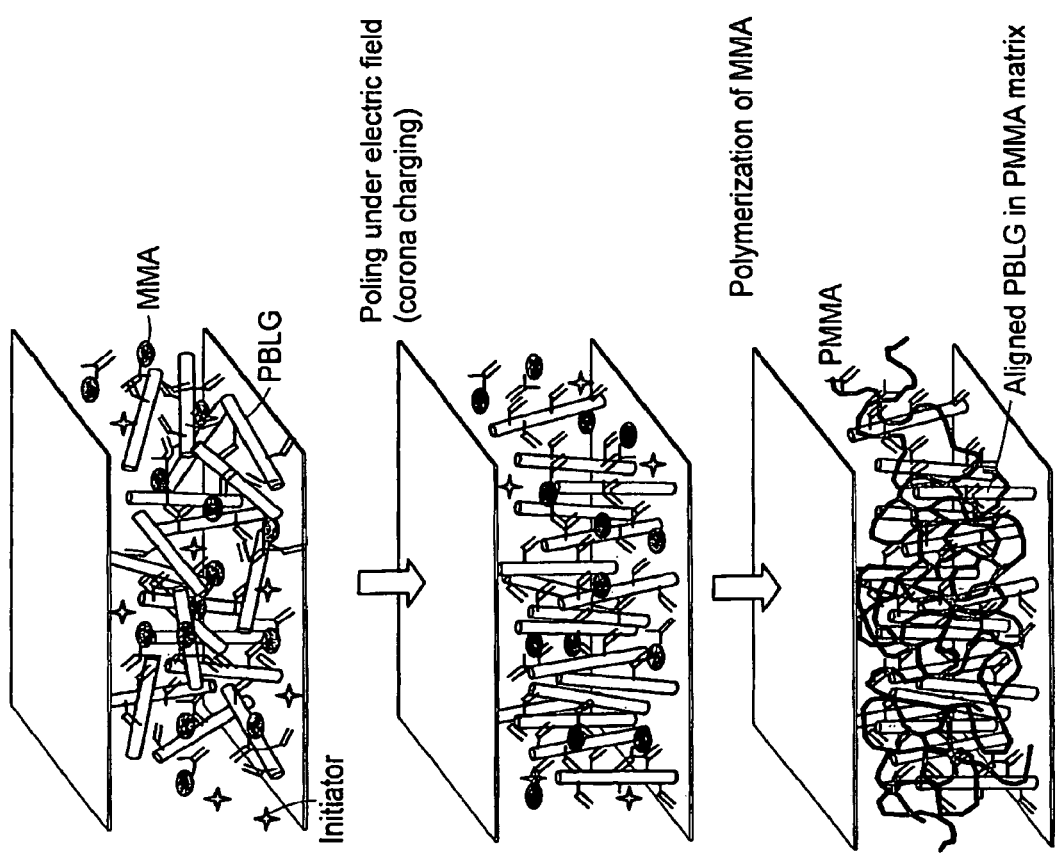
FIG. 3 shows the schematic depiction of the corona charging and fabrication of PBLG/PMMA composite film. The figure also shows an actual composite film produced by the depicted fabrication process.
Figure 3:
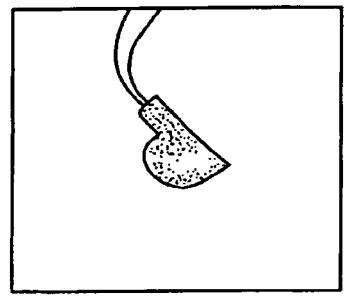

Referring to the drawings, FIG. 2 shows polar and piezoelectrically active film formed by orienting the PBLGs in the direction normal to the film surface. The Fourier Transform Infrared (FT-IR) spectroscopy confirms the α-helical structure of PBLG within the PBLG/PMMA composite film. FIG. 3 shows the schematic depiction of corona charging and a preferred fabrication of PBLG/PMMA composite film. FIG. 3 also shows an actual composite film produced by such depicted fabrication process.

In certain preferred aspects, the present invention is directed towards fabricated thick PBLG-PMMA composite film (e.g. thickness: ≥20, 30 or 40 μm) such as by corona poling and polymerization of PBLG/MMA mixture solution.

The compounds herein may contain one or more asymmetric centers and thus occur as racemates and racemic mixtures, single enantiomers, individual diastereomers and diastereomeric mixtures. Compounds suitable for use in the methods of the present invention include any and all different single pure isomers and mixtures of two or more isomers. The term isomers is intended to include diastereoisomers, enantiomers, regioisomers, structural isomers, rotational isomers, tautomers, and the like. All such isomeric forms of these compounds are expressly included in the present invention.

The compounds herein may also contain linkages (e.g., carbon-carbon bonds) wherein bond rotation is restricted about that particular linkage, e.g. restriction resulting from the presence of a ring or double bond. Accordingly, all cis/trans and E/Z isomers are expressly included in the present invention. The compounds herein may also be represented in multiple tautomeric forms, in such instances, the invention expressly includes all tautomeric forms of the compounds described herein, even though only a single tautomeric form may be represented (e.g., alkylation of a ring system may result in alkylation at multiple sites, the invention expressly includes all such reaction products). All such isomeric forms of such compounds herein are expressly included in the present invention. All crystal forms and polymorphs of the compounds described herein are expressly included in the present invention. The term isomers is intended to include diastereoisomers, enantiomers, regioisomers, structural isomers, rotational isomers, tautomers, and the like. For compounds which contain one or more stereogenic centers, e.g., chiral compounds, the methods of the invention may be carried out with a enantiomerically enriched compound, a racemate, or a mixture of diastereomers.

Preferred enantiomerically enriched compounds have an enantiomeric excess of 50% or more, more preferably the compound has an enantiomeric excess of 60%, 70%, 80%, 90%, 95%, 98%, or 99% or more. In preferred embodiments, only one enantiomer or diastereomer of a chiral compound of the invention is administered to cells or a subject.

Methods of Making the Piezoelectric Polymer Composites of the Invention

In one aspect, the invention provides for a method of making a piezoelectric resin blend comprising (a) a piezoelectrically active polymer and (b) a matrix polymer, comprising the steps of (A) dissolving a piezoelectrically active polymer in a matrix polymer monomer solution; and (B) polymerizing the matrix polymer monomer.

In one embodiment, the method further comprises the step of curing the polymer composite resin blend.

In certain instances, the step of polymerizing of the matrix polymer monomer comprises corona charging treatment. In other instances, the step of polymerizing of the matrix polymer monomer comprises radial initiation.

In other embodiments, the step of curing of the polymer composite comprises corona charging treatment.

In still other embodiments, the piezoelectrically active polymer is soluble in the matrix monomer.

In one embodiment, the step of dissolving the piezoelectrically active polymer in a matrix polymer monomer takes place between about 40° C. and 60° C.

In another embodiment, the piezoelectrically active polymer comprises from about 5% to about 50% (w/w) of the matrix polymer monomer solution. In a further embodiment, the piezoelectrically active polymer comprises from about 15% to about 40% (w/w) of the matrix polymer monomer solution.

In certain embodiments, the polymerization step takes place between about 40° C. and 100° C. In a further embodiment, the polymerization step takes place between about 60° C. and 70° C.

During the step of the step of polymerizing of the matrix polymer monomer using radial initiation, the radial initiator is 1,1'-azobix-(cyclohexanecarbonitrile) (ACHN) or azobisisobutyronitrile (AIBN).

The step of corona charging suitably comprises the step of applying a voltage across the polymers. In one embodiment, the voltage ranges from about 10 to about 1000 V. In other embodiments, the voltage is increased during the corona charging cure process.

In one aspect, the invention provides a method of making a piezoelectric resin blend comprising (a) a piezoelectrically active polymer and (b) a matrix polymer, comprising the steps of (A) dissolving a piezoelectrically active polymer in an organic solvent; (B) adding a matrix polymer monomer solution; (C) poling the polymer composite material such as by corona charging; and (D) polymerizing the matrix monomer such as by radial initiation.

In another aspect, the invention provides a method of making a piezoelectric resin blend comprising (a) a piezoelectrically active polymer and (b) a matrix polymer, comprising the steps of (A) dissolving a piezoelectrically active polymer in an organic solvent; (B) adding a matrix polymer monomer solution; (C) poling the matrix polymer monomer; and (D) curing the polymer composite material resin blend such as by corona charging.

In certain embodiments, the organic solvent is selected from chloroform, methylene chloride, dimethyl formamide (DMF), dimethylsulfoxide (DMSO), benzene, toluene, cumene, tetrahydrofuran (THF), dietheyl ether, methyl tert-butyl ether, ethyl acetate, and combinations thereof.

Use of Piezoelectric Polymer Materials

Piezoelectric transducers (sensors and actuators) can be critical elements of automatic control systems, and measurement and monitoring systems. They have become ubiquitous in our world, being found in everything from hearing aids to automobiles, from clothing dryers to perimeter sensors and vector sensors, and from elevators to computers. Most of the current piezoelectric materials are ceramic materials (barium titanate, lead zirconate titanate) which require high temperature processing in the presence of a high electric field in order to render them piezoelectric. They tend to be expensive and brittle materials. Making large flexible piezoelectric film is not possible with current technology. Piezoelectric polymers have been developed; however they generally loose their piezoelectricity at low temperature (50° C.-80° C.) and its use is limited to low temperature conditions.

The polymers provided in the invention are used to improve performance of conventional products (e.g. microphone, speakerphone, large area speaker/micro phones and phone arrays, piezoelectric coatings and pressure sensors). For example, a simple microphone that does not require pressure equalization can be constructed using this polymer film. Above all, this invention allows utilization of piezoelectric technology in unconventional products such as piezoelectric coatings or a speaker in a form of a wall paper. In certain embodiments, the current invention provides for a microphone or speakerphone in a form of a coating or paint. It can be used to design a light weight transducer, a foldable speaker or speaker array.

For example, the polymer composite material of the invention allows simple piezoelectric microphone structure with three obvious advantages when compared to conventional condenser and electret microphones. First, by eliminating the need for static pressure equalization the piezoelectric microphone is better suited for low frequency operation as well as more reliable for transportation to environments with differing atmospheric pressures. Second, by eliminating the need to suspend a membrane under tension, the piezoelectric microphone is made more rugged and reliable. Typical electret and condenser microphone failure is catastrophic rupture of the membrane, and the result is a microphone which totally loses signal strength. By contrast, a piezoelectric microphone made of the polymers of the invention could suffer localized damage such as a small tear or electrode delamination, in a part of the piezoelectric material and it would still produce a signal from the remainder of the film. Thus, the typical failure would lead to a gradual loss of signal strength. Third, by building a large microphone, one may eliminate the need for a powered impedance-matching device, making it possible to create a self-powered microphone. This is much more likely in the piezoelectric microphone than in the electret or condenser, since the dielectric constant of a piezoelectric material is much greater than that of air resulting in lower impedance.

In certain embodiments, the microphone system of the present invention includes a micro electro mechanical system (MEMS) microphone which may include the following components: a front volume portion and a rear volume portion, a first audio port accessing the front volume portion, a second audio port accessing the rear volume portion of the microphone, and a switch for sealing and unsealing the second audio port. Second audio port provides directionality to the system and will also be referred to herein as directional port. The switch is preferably a movable MEMS switch. The microphone system realizes dual microphone behavior by incorporating the movable MEMS switch that closes or opens the directional port thus making the microphone have omni or directional behavior respectively. The directional port is therefore a selectable directional port that can be enabled by closing the switch and disabled by opening the switch. The movable MEMS switch can easily be manufactured along with the microphone diaphragm and other electrically active elements using the same, related or complementary MEMS process. Movable MEMS switch can be formed of a variety of MEMS elements such as cantilever beams, torsional beams, sliding disks, and other MEMS elements which are well known in the art. The movable MEMS switch can be controlled by piezoelectric means, wherein the piezoelectric means comprises a material of the instant invention.

The piezoelectric microphone system of the present invention can be readily implemented and hence has wide application in acoustics system for many communication products. The microphone system of the present invention is particularly suited for communication devices that can operate in both conventional close-talking and hands-free speakerphone modes of operation. In addition to switching from one microphone mode to the other, the microphone system can, in accordance with the present invention, also adjust a variety of microphone parameters such as microphone sensitivity, microphone gain and bias voltage to further fine-tune the performance of the microphone system for a particular operating mode.

Accordingly, there has been provided a microphone system that provides for the advantages of piezoelectric materials (described above), and enables a high quality audio experience in the hands-free mode as well as the close-talking mode of a communication device. The use of a MEMS microphone in conjunction with at least one audio port coupled to the MEMS microphone provides directional functionality and the ability to switch between two microphone modes using a single microphone. By utilizing additional ports along with varying the path lengths and/or using different acoustic flow resistance material in the ports, the microphone system can provide further dynamic variation of the directionality and time delay. Thus, the microphone system of the present invention provides dynamic acoustic control of the audio in addition to the ability to switch between hands-free mode and close-talking mode.

The microphone system of the present invention also provides significant advantages over traditional microphone systems in that it can be implemented within a communication device using automated assembly practices. The MEMS microphone need only be mounted to one side of a board thereby simplifying the entire assembly as compared to standard electret microphones which are typically mounted via through holes on a printed circuit board (PCB) or flex assembly. Since MEMS devices are smaller and slimmer in size than standard electret microphones, the microphone system of the present invention takes up less space than standard microphone assemblies.

According to one embodiment of the invention, a piezoelectric speaker comprises a piezoelectric member for generating a vibration according to an electric signal applied thereto. The piezoelectric member comprises the piezoelectric polymer, membrane, and films of the invention. A piezoelectric vibration plate converts the vibration to a sound while being closely contacted to the piezoelectric member. The piezoelectric vibration plate is divided into parts of any configuration and is connected to the piezoelectric member.

According to this embodiment, since the piezoelectric vibration plate is divided into parts of any configuration, the distortion cannot be easily caused when the vibration plate vibrates and thus it is possible to ensure a uniform sound in a broad band and to easily reproducing a signal of large amplitude or sound.

According to another preferred embodiment of the present invention, a piezoelectric speaker comprises a piezoelectric member for generating a vibration according to an electric signal applied thereto. A piezoelectric vibration plate converts the vibration to a sound while being closely contacted to the piezo-electric member. The piezoelectric vibration plate is divided into several parts by dividing slits that extend from a position near the center of the piezoelectric vibration plate to the periphery.

According to this embodiment, since the piezoelectric vibration plate is divided by dividing slits, the distortion cannot be easily caused when the vibration plate vibrates. The vibration can be efficiently propagated from the center of the piezo-electric member to the periphery. Thus it is possible to ensure a uniform sound in a broad band and to easily reproducing a signal of large amplitude or sound.

In certain embodiments, it is an object of the invention to provide a sensor, which comprises a microphone having a circular vibration surface, a cylindrical cushion unit and a case unit can be readily mounted. The directivity of the sensor, for example, in a horizontal direction is different from that in a vertical direction. The sensor is provided with an ultrasonic microphone, a substantially cylindrical cushion unit and a case unit. The ultrasonic microphone includes a piezoelectric device comprising a piezoelectric polymer, film, or material of the invention, and a housing member, which has a cylindrical side wall portion and a vibration portion disposed at a front end of the side wall portion. The vibration portion has a circular outer surface which is a vibration surface. The piezoelectric device is fixed to an inner surface of the vibration portion. The cushion unit has at least one cushion-side engagement portion, which axially protrudes from a rear end surface of the cushion unit. The cushion unit is resilient. The case unit is provided with a fitting portion, which has therein a cylindrical engagement hole and at least one case-side engagement portion formed at a surface of the engagement hole. The ultrasonic microphone is inserted in the cushion unit, and the cushion unit is inserted in the engagement hole. The cushion-side engagement portion is engaged with the case-side engagement portion so that the cushion unit is restricted from axially moving.

In this case, the cushion-side engagement portion axially protrudes from the rear end surface of the cushion unit, to be capable of bending toward the diametrically inner side of the engagement hole of the case unit when the cushion unit is inserted into the engagement hole. Therefore, the cushion-side engagement portion is provided with a sufficient clearance, so that the cushion unit can be readily inserted into the engagement hole as compared with the related art. Thus, the operation performance of the ultrasonic sensor is substantially improved.

In other embodiments, an ultrasonic sensor is provided with an ultrasonic microphone, a substantially cylindrical cushion unit and a case unit. The ultrasonic microphone includes a housing member and a piezoelectric device, comprising a piezoelectric polymer, film, or material of the invention. The housing member has a cylindrical side wall portion and a vibration portion disposed at a front end of the side wall portion. The vibration portion has a circular outer surface which is a vibration surface. The piezoelectric device is fixed to an inner surface of the vibration portion. The cushion unit is resilient. The case unit has a fitting portion, which is provided with a cylindrical engagement hole therein. The ultrasonic microphone is inserted in the cushion unit, and the cushion unit is inserted in the engagement hole of the fitting portion. The cushion unit and the fitting portion are respectively provided with at least one cushion-side guide portion and at least one fitting-side guide portion, which are engaged with each other. The cushion unit is axially guided to be inserted into the fitting portion, and restricted from circumferentially rotating.

In certain embodiments, the invention provides for data communicators which may be configured to communicate acoustically. For example, the first data communicator may be a microphone and the other data communicator a loudspeaker with, in this case, data being communicated from the passive data storage device to the first data communicator as acoustic signals, preferably short pulses. In this case, it may be possible to use a microphone of the mobile telephone as the first data communicator. The acoustic coupling between the data couplers is achieved by the use of piezoelectric transducers. Other forms of data communication between the data communicators may be used such as, for example, mechanical vibration, electrostatic and electromagnetic signals.

The following non-limiting examples are illustrative of the invention.

EXAMPLE 1

Figure 4A:
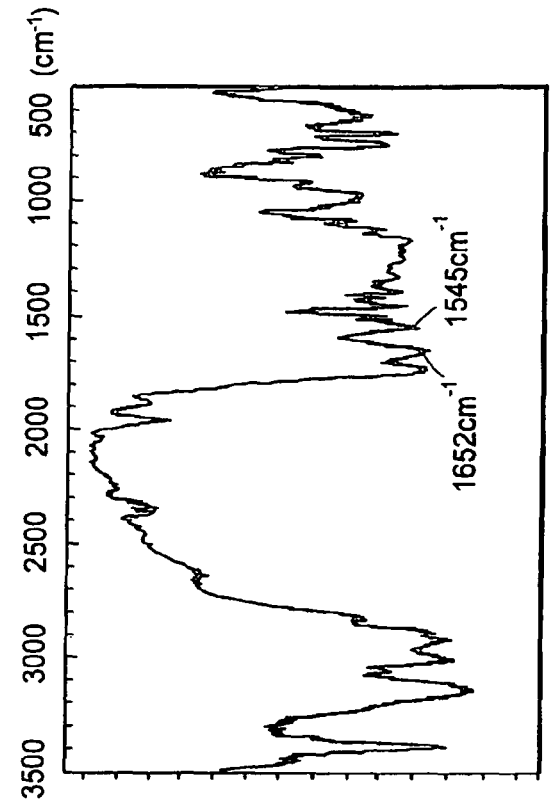
FIG. 4a shows the polarized light optical micrograph of PBLG/PMMA film (15% PBLG). The x-ray diffraction pattern of the composite film with the x-ray beam direction parallel to the film surface.

For a polypeptide, PBLG has unusually high solubility in organic solvent and is able to form concentrated lyotropic liquid crystalline phases. PBLG remains in piezoactive α-helical form in solutions and even in solid state after solvent is evaporated. This extreme solubility and helical stability allowed for the use of PBLG-polymer composite materials for the development of flexible piezoelectric films. Since PBLG solutions and most other conventional polymer solutions are not miscible, it was decided to fabricate the composite film by polymerizing/curing a monomer-PBLG mixture solution. Before fabrication of the composite, it was important to first show that the PBLG-PMMA solution would polymerize to form a stable composite film, while maintaining the piezoelectrically active alpha-helical conformation. In addition, it was also needed to verify that macroscopic phase separation did not exist in the polymer. When the solubility of PBLG in various polymerizable liquid monomers was tested, it was discovered that up to 15% of PBLG (DP=150) could be dissolved in methylmethacrylate monomer liquid. After addition of the initiator (AIBN), PBLG-MMA mixture solution was transferred to a Teflon plate and was allowed to polymerize at 60° C. for 6 hrs in a closed container/vial producing a milky white solid film. The cured film (approximately 2×2 cm$^2$, 50 μm thick) exhibited homogeneous visual appearance throughout the film without any indications of macroscopic phase-separation. FIG. 4a shows the polarized light optical micrograph of PBLG/PMMA film (15% PBLG). The texture of the micrograph is similar to that of the concentrated PBLG liquid crystalline solution (FIG. 1, inset) suggesting that PBLG has maintained its rod-like character and that polymerization process did not cause bulk phase separation.

Figure 4B:
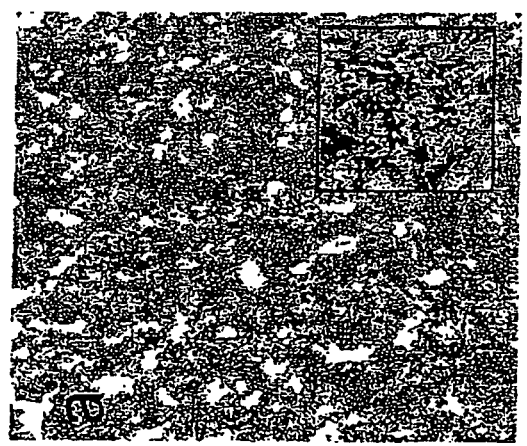
FIG. 4b shows that the FT-IR of a composite film demonstrating that the polypeptide's amide I and amide II absorption bands were in agreement with α-helical conformation.
Figure 5:
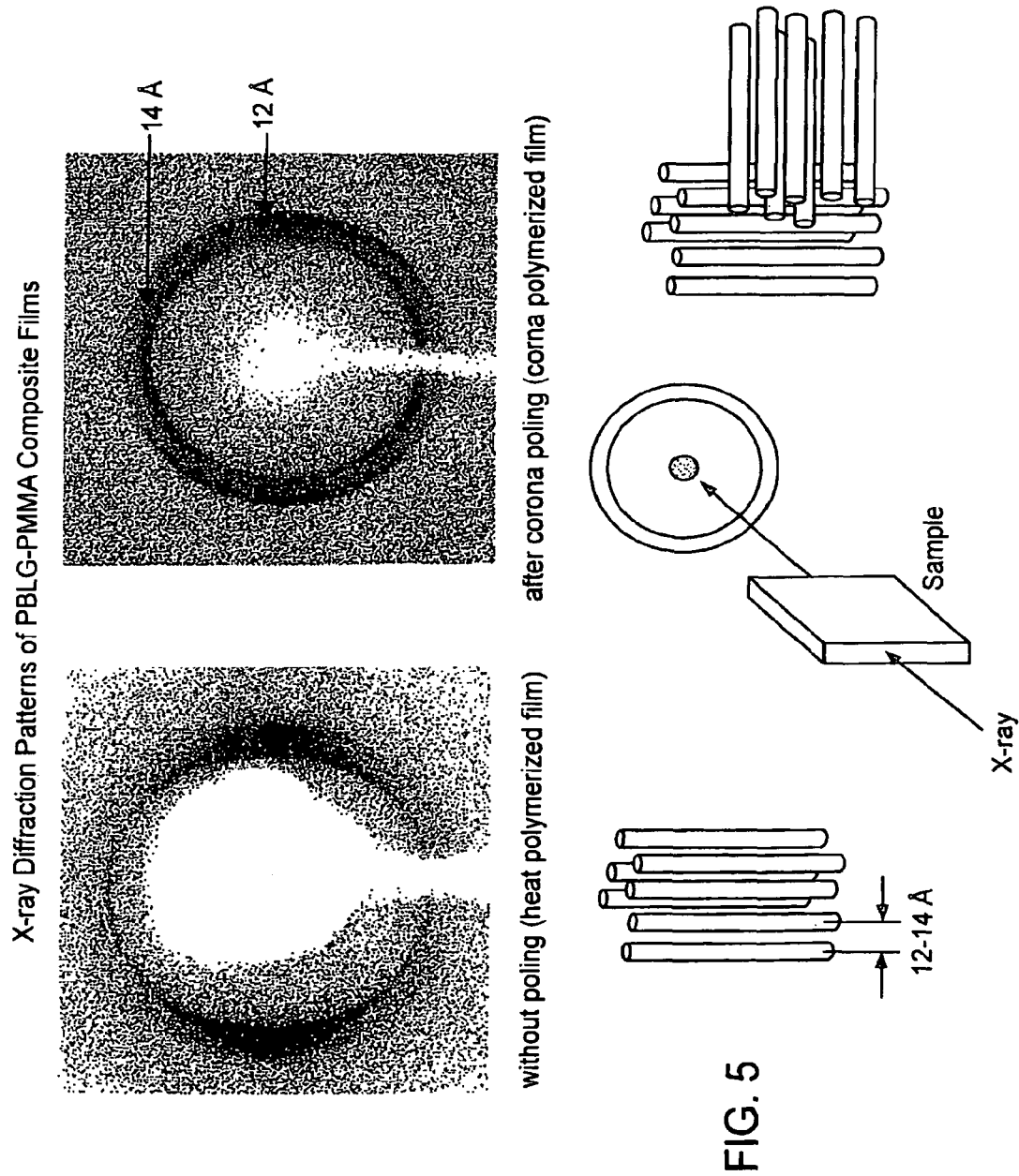
FIG. 5 shows x-ray diffraction patterns (beam direction parallel to the film surface) of heat polymerized (non-poled) composite film, and corona-poled and -polymerized composite film.

Fourier Transform Infrared (FT-IR) spectroscopy was performed to confirm the α-helical structure of PBLG within the PBLG/PMMA composite film (FIG. 4b). Due to the clean IR window provided by the PMMA matrix between 1500$^{-1}$ and 1700 cm$^{-1}$, the amide I (1650 cm$^{-1}$) and amide II (1546 cm$^{-1}$) absorption bands that are characteristic to α-helical polypeptides were observed. After confirming the integrity of the PBLG α-helices, X-ray diffraction was employed to study the morphology of the composite film, especially the packing structure and orientation of PBLG rods. FIG. 5 shows the x-ray diffraction pattern of the composite film with the x-ray beam direction parallel to the film surface. The diffraction pattern is consistent with solid state PBLG x-ray diffraction pattern reported in the literature; however, in addition to the small angle Bragg reflection at 12 Å, known to correspond to the inter-PBLG spacing of pure PBLG solid, another reflection with similar intensity is detected at a spacing of 15 Å. This spacing is similar to the inter-rod distance of PBLG in liquid crystalline solution where the increased distance results from inclusion of solvents in between the PBLG rods. It is believed that during the polymerization, PBLGs dispersed in MMA are able to form two different aggregates that either include or exclude PMMA. The two Bragg reflections are mainly located at the equator of the diffraction pattern, indicating that most of the PBLG rods are oriented parallel to the film surface. However, not all PBLG rods are lying completely flat within the film and there is a small component of PBLG vector in the direction normal to the film surface evidenced by diffuse diffraction spot that extends out from the main spot on this equator. This is caused by random thermal motion of the PBLG rods during the film formation and does not lead to piezoelectricity. In fact, this film produced no $d_{33}$ response when tested by our static d33 measurement apparatus.

EXAMPLE 2

In order to form polar PBLG-PMMA composite film of high $d_{33}$ piezoelectricity, it was decided to employ corona charging to pole the PBLG rods and orient the rods in the direction perpendicular to the film surface. Corona charging is commonly used to render polymers piezoelectric. Corona is a preferred method for poling the PBLG rods because it allows us to expose the system to extremely high fields. Corona also aids in the polymerization process, which was discovered when curing the composite without the initiator. Although breakdown charging would be an alternative method for poling, the limitations of the test equipment would not allow the accommodation of a liquid solution prior to polymerization.

When corona was applied to the PBLG-MMA-AIBN mixture solution at 60° C., the volatile MMA monomers quickly evaporated from the charging station and no composite film was produced. Only PBLG powders and AIBN crystals were present after corona charging. After subsequent fabrication attempts at various polymerization conditions, it was discovered that even without the initiator, polymerization spontaneously takes place under corona at room temperature. The composite film produced this way had similar visual appearance to the non-charged thermally polymerized film described above. It is understood that MMA polymerization was initiated by the reactive species (e.g. radical or ionic molecules) created under the corona, the charge-induced breakdown products of atmospheric gas molecules. It was also discovered that polymerization can take place on the composite film with or without a grid. When this work was started, a −10 Kv corona, with a −6 KV grid was utilized. The grid serves to lower the potential felt by the mixture solution. Our research has shown that it is capable to form a film with corona charging as low as −6 KV; however, higher fields are required in order to ensure that the PBLG rods are oriented perpendicular to the film surface.

The composite film was fabricated by charging and curing the PBLG-MMA mixture solution for 30 minutes under ambient conditions, using −15 KV corona apparatus. The charging process began by applying the PBLG-MMA mixture solution to a Teflon plate. The Teflon plate is anchored to a metal support and contains cavities that aid in the formation of the composite film in various uniform shapes and sizes. After the mixture solution was applied to the fixture, the fixture was placed on the grounded electrode, and charged in the presence of a −15 KV field. The corona tip was ~4 inches away from the sample during the charging process. The composite film was formed within 30 minutes, allowed to dry, and then peeled off of the fixture.

Figure 4C:
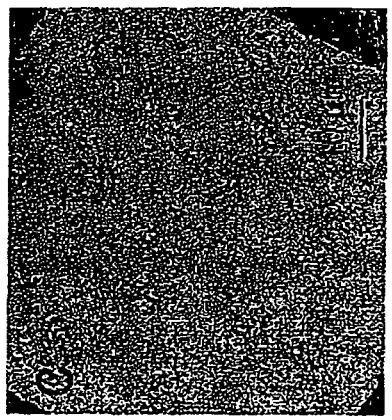
FIG. 4c shows the transmission electron micrograph (TEM) of PBLG/PMMA composite film.

When the composite film was analyzed by FT-IR (FIG. 4) spectroscopy, polypeptide's amide I and amide II abosorption bands were in agreement with α-helical conformation (FIG. 4). The films polarized optical micrograph was also similar to the lyotropic liquid crystalline and thermally polymerized composite film (data not shown). X-ray diffraction of the corona charged films showed a diffraction pattern distinctively different from the thermally polymerized film (FIG. 5). Although the corona charged film showed two Bragg reflections of 12 Å and 15 Å spacings, almost identical to the thermally polymerized film, the diffraction spots corresponding to the 15 Å spacing appeared on a meridian which is orthogonal to the 12 Å diffraction spot. This indicates that PBLG rods that are separated by a wider 15 Å spacing have responded to the corona charging and are oriented along the corona field in the direction perpendicular to the film surface but orientation of the tightly packed PBLG rods (12 Å) were unaffected by the corona.

It is believed that PBLG exists in two different states in MMA solution; one dispersed in MMA and the other in aggregate. Only the PBLG well dispersed in MMA are mobile enough to respond and orient itself along the electric field.

Figure 6:
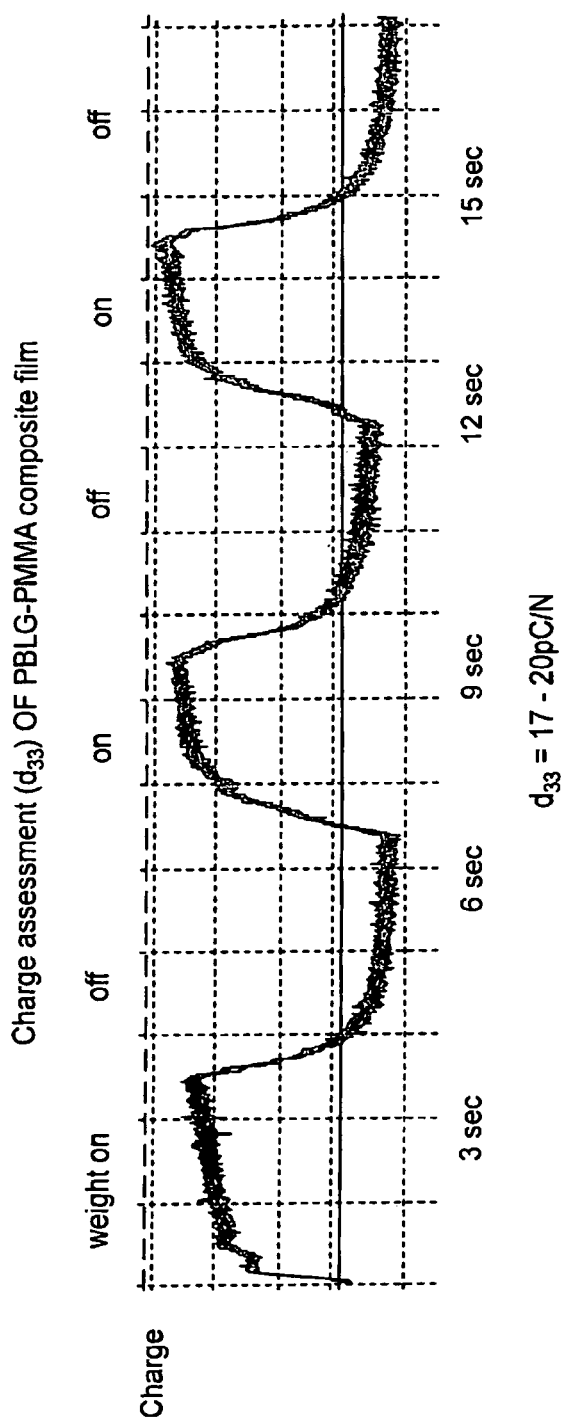
FIG. 6 shows charge assessment of PBLG/PMMA composite film during static loading.

Before any testing was performed, electrodes were placed on both sides of the composite film. The corona charged composite film's $d_{33}$ piezoelectricity was measured using a quasi-static methodology. The piezoelectric evaluation process was conducted using calibrated weights, a custom made piezo-evaluation apparatus, a Keithley meter, and a digital oscilloscope. The Keithley meter is attached to the piezoelectric evaluation apparatus. This system interfaces with a digital oscilloscope. The Keithley meter displays the charge response of the sample, which is generated by applying a calibrated weight to the sample. As the weight is applied and removed, a corresponding change in the charge response was monitored. A digital scope was utilized to capture the profile of the charge response. After the charge measurements were made, the $d_{33}$ coefficient was determined by taking the ratio of the charge response to the net mechanical force applied. FIG. 6 shows the real-time capture of charge assessment during loading and unloading. The charge profile in FIG. 6 demonstrates the loading (lo) and unloading (high) of a 230 g calibrated weight. This profile represents the presence of the piezoelectric effect in the composite film. The profile corresponds to a $d_{33}$ of ≈20 pC/N and is generated when the composite film is compressed. This result is an order of magnitude lower than LDPP and comparable to PVDF.

Figure 7:
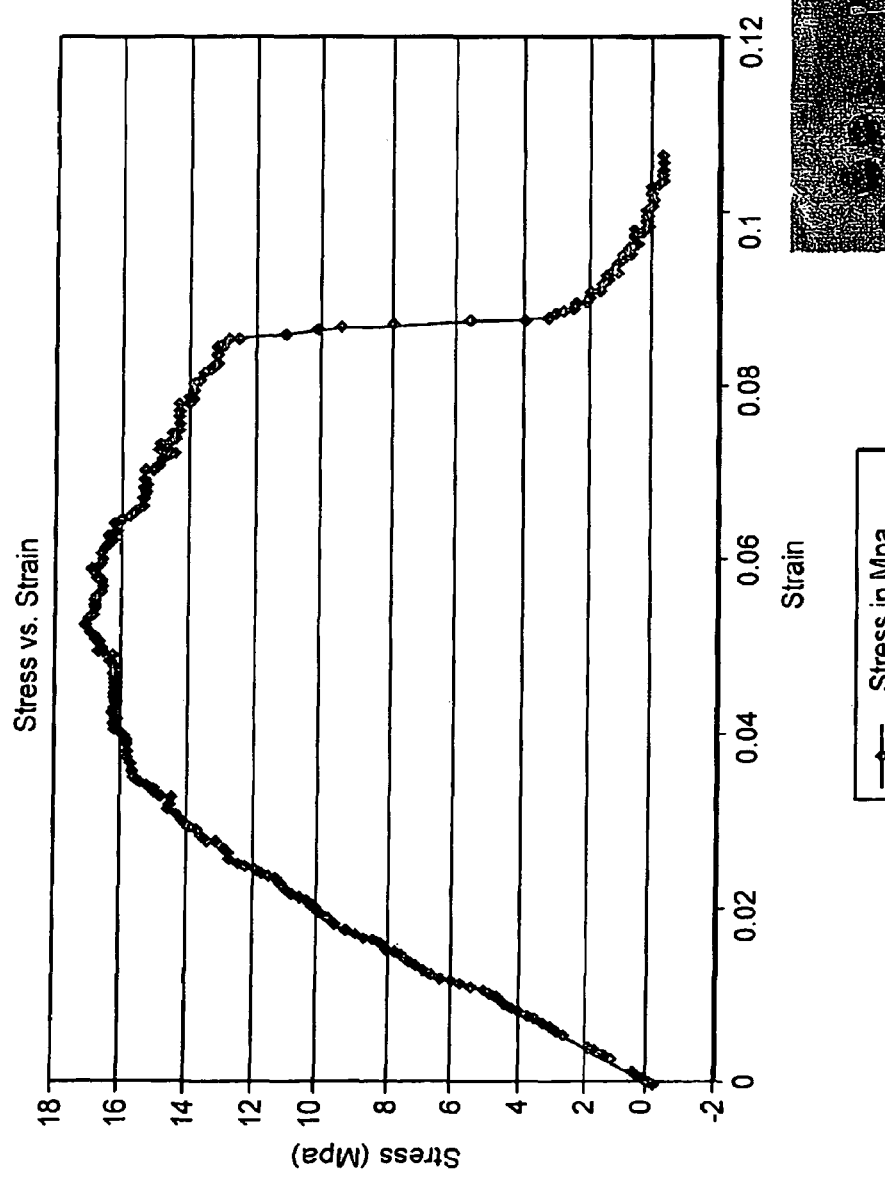
FIG. 7 shows stress-strain curve of the tensile test of the composite film.

Finally, the film's mechanical properties were tested using Instrom test equipment. The sample experienced varying loads until fracture. The specimen under test was designed for optimal tensile testing. This proved to be another advantage, as the charging process with a solution mixture and curing in a mould/cavity offers the flexibility to customize the final composite film design. The stress-strain curve of the corona charged film is shown in FIG. 7. The tensile strength of the composite film was determined to be 14 MPa, and further analysis revealed a Young's Modulus (E) of ≈150 MPa. In comparison with some of the other known polymer modulus, the composite film appears to be fairly strong and flexible.

EXAMPLE 3

Material Polarization

The experiments began by employing corona charging techniques to in-situ PBLG and MMA. PBLG was dissolved in MMA to a given concentration. This solution was exposed to corona charging as described below.

During the corona charging process, the 15 KV corona was directly applied to PBLG-PMMA mixture solution at room temperature. After the 10 to 30 min corona exposure, the solidified PBLG composite sample was allowed to sit for additional 30 min and pealed from the Teflon fixture.

Comparisons were made between a poled and non-poled PBLG sample, and between a poled PBLG and a poled low density polypropylene (LDPP-VHD40) sample. All measurements were made using quasi-static techniques. The results are shown in the Tables 1 and 2 below.

TABLE 1

Non-Poled vs. Poled Bio-Polymer

| Sample A | Temperature (C.) | Max. Measured Voltage (V) |
| --- | --- | --- |
| Non-Poled Bio-Polymer | 25 C. | 800 mV |
| Poled Bio-Polymer | 25 C. | 4.4 V |

TABLE 2

Poled Bio-Polymer vs. Poled LDPP

| Sample B | Temperature (C.) | Max. Measured Voltage (V) |
| --- | --- | --- |
| Poled Bio-Polymer | 25 C. | 5.5 V |
| Poled LDPP | 25 C. | 8.0 V |

The above results show that the PBLG is in fact piezoelectric and that the poled biopolymer sample may have significant potential, particularly since the results demonstrate a preliminary experiment without any optimization of the poling condition. Polymer produced similar results after 2 months. demonstrating that the sample remained stable and that the results are reproducible.

EXAMPLE 4

Determination of Piezoelectric Materials

The following slightly modified experiment began by employing corona charging techniques to in-situ PBLG and MMA, with varying concentrations.

The chemical ratio of each compound can be found in the table below. The corona charging process for this experiment was identical to that described above. All measurements were made using quasi-static techniques. Three different samples were created during this analysis.

TABLE 3

Analysis of Biopolymer w/Variations in the PBLG

| Compound | Sample #1 | Sample #2 | Sample #3 | Max. Measured Voltage |
| --- | --- | --- | --- | --- |
| MMA (monomer) | 1 mL | 1 mL | 1 mL | 0.375 V |
| PBLG | 200 mg (DP = 100) | 300 mg (DP = 100) | 100 mg (DP = 500) | 2.5 V |
| ACBN (initiator) | 40 mg | 40 mg | 40 mg | 0.6 V |

Experimental data was also collected on samples using a PBLG-copolymer blend in an effort to achieve a more flexible sample and therefore higher piezoelectric constant. Using solvent casting techniques, the PBLG and copolymer (PBLG-PMMA) were mixed and polymerized in the presence of a −1.2 KV field. Data associated with this experiment will be presented, but analysis thus far reveals that this combination may contain significant piezoelectric $d_{31}$ constants.

The results indicate that the biopolymer is in fact piezoelectric. To validate this, an x-ray diffractometer (with aerial detector) was used on both the non-poled and poled samples to help us accurately assess whether the dipoles were aligned in the same direction. The x-ray results revealed that the dipoles are indeed aligned in the same direction (horizontal) for all non-poled samples, as expected. X-ray analysis of the poled samples show that charging at the original grid voltage (600V) lifted some of the dipoles up to about 15 degrees. This small variation was enough to cause the sample to produce piezoelectric characteristics. The ultimate goal is to have all of the dipoles standing, and as such, we have begun exploring the idea of charging the samples under a higher grid voltage (and even eliminating the grid) to optimize the results that we have obtained. In addition, we have started the process of evaluating the $d_{31}$ constants of the samples and are continuously investigating ways to improve the results obtained to date.

The contents of all references (including literature references, issued patents, published patent applications, and co-pending patent applications) cited throughout this application are hereby expressly incorporated herein in their entireties by reference.

Equivalents

Those skilled in the art will recognize, or be able to ascertain using no more than routine experimentation, many equivalents to the specific embodiments of the invention described herein. Such equivalents are intended to be encompassed by the following claims.

What is claimed:

1. A piezoelectric resin blend comprising:
   (a) a piezoelectrically active polymer that is a polymer or copolymer selected from poly(γ-benzyl α,L-glutamates) (PBLG), vinyl PBLG, polystyrene, polypropylene, low density polypropylene, polyvinylidene fluoride (PVDF), poly(vinylidene fluoride-trifluoroethylene) [P(VDF-TrFE)], poly(oxymethylene), nylon 6, nylon 66, nylon 610, epoxies, polyurethanes, cellulose, foam fluorinated ethylene propylene copolymer (FEP), glass beaded fluorinated ethylene propylene copolymer (FEP), porous polytetrafluoroethylene (PTFE), glass resins, or mixtures thereof; and
   (b) monomers for the formation of a matrix polymer that is poly(methylmethacrylate) (PMMA), polyethylene, polyvinylchloride, poly(l-butene), or a silicone elastomer; and
   wherein the piezoelectric polymer comprises from about 5% to about 50% (w/w) of the resin blend.

2. The piezoelectric resin blend of claim 1 wherein the piezoelectrically active polymer is poly(γ-benzyl α,L-glutamate) (PBLG).

3. The piezoelectric resin blend of claim 1 wherein the piezoelectrically active polymer is a polymer or copolymer selected from low density polypropylene, foam copolymer FEP, glass beaded copolymer FEP, porous PTFE, glass resins, and mixture thereof.

4. The piezoelectric resin blend of claim 1 wherein the piezoelectrically active polymer consists of repeat units ranging from about 20 to about 3500.

5. The piezoelectric resin blend of claim 1 wherein the piezoelectrically active polymer is a cross-linked polymer.

6. The piezoelectric resin blend of claim 1 wherein the matrix polymer is a silicone elastomer.

7. The piezoelectric resin blend of claim 1 wherein the blend is thermally stable.

8. A piezoelectric resin blend, comprising
   (a) a piezoelectrically active polymer that comprises poly(γ-benzyl α,L-glutamates) (PBLG); and
   (b) monomers for the formation of a matrix polymer that is poly(methylmethacrylate) (PMMA); and
   wherein said piezoelectrically active polymer is oriented along a poling direction.

* * * * *